United States Patent [19]
Zook

[11] Patent Number: 5,592,498
[45] Date of Patent: Jan. 7, 1997

[54] CRC/EDC CHECKER SYSTEM

[75] Inventor: Christopher P. Zook, Longmont, Colo.

[73] Assignee: Cirrus Logic, Inc., Fremont, Calif.

[21] Appl. No.: 306,917

[22] Filed: Sep. 16, 1994

[51] Int. Cl.$^6$ ................................................. G11C 29/00
[52] U.S. Cl. ........................................ 371/40.1; 371/40.4
[58] Field of Search .................................. 371/37.1, 37.5,
371/37.4, 38.1, 39.1, 40.1, 40.2, 40.3, 40.4

[56] References Cited

U.S. PATENT DOCUMENTS

| | | | |
|---|---|---|---|
| 3,851,306 | 11/1974 | Patel | 371/37.4 |
| 3,868,632 | 2/1975 | Hong et al. | 371/37.4 |
| 4,703,485 | 10/1987 | Patel | 371/37.1 |
| 4,782,490 | 11/1988 | Tenegolts | 371/40 |
| 5,151,902 | 9/1992 | Grallert | 371/5.1 |
| 5,218,691 | 6/1993 | Tuma et al. | 395/500 |
| 5,220,568 | 6/1993 | Howe et al. | 371/37.1 |
| 5,291,584 | 3/1994 | Challa et al. | 395/500 |
| 5,297,148 | 3/1994 | Harari et al. | 371/10.2 |
| 5,329,535 | 7/1994 | Coker | 371/39.1 |
| 5,384,786 | 1/1995 | Dudley et al. | 371/37.1 |
| 5,422,895 | 6/1995 | Nguyen et al. | 371/37.5 |

FOREIGN PATENT DOCUMENTS

| | | |
|---|---|---|
| 0230730 | 8/1987 | European Pat. Off. . |
| 0291167 | 11/1988 | European Pat. Off. . |

OTHER PUBLICATIONS

Patent Abstracts of Japan, vol. 13, No. 70 (P–829), 17 Feb. 1989 & JP–A–63 255876 (Matsushita) 24 Oct. 1988—see abstract.

Patent Abstracts of Japan, vol. 13, No. 73 (P–830), 20 Feb. 1989 & JP–A–63 257966 (Matsushita) 25 Oct. 1988—see abstract.

Primary Examiner—Roy N. Envall, Jr.
Assistant Examiner—Emmanuel L. Moise
Attorney, Agent, or Firm—Nixon & Vanderhye P.C.

[57] ABSTRACT

EDC/CRC checker (70) performs an EDC/CRC check as a block of data is being corrected during a correction pass, thereby obviating buffer access for EDC/CRC purposes subsequent to block correction. During the correction pass, an EDC/CRC sum is accumulated which, upon completion of the pass of the block, is zero if EDC/CRC bytes in the block confirm that the block has been corrected. During the single correction pass of the block, bytes of an uncorrected, most-recent codeword are added to the accumulated sum. Bytes of a previous codeword which have a byte synchronization relationship with the byte of the most-recent codeword are corrected (if necessary), and (when correction occurs) error pattern factors including error patterns used to correct the bytes of the previous codeword are also added to the accumulated sum. In the illustrated embodiment, the block is conceptualized as having columns of codewords and the byte synchronization relationship is such that when an uncorrected byte is being accumulated, correction occurs for a corresponding byte of a next previous codeword. Various embodiments of the invention are capable of handling a plurality of codewords simultaneously.

36 Claims, 8 Drawing Sheets

Fig. 2

|    |      |      |      |     |      |      |
|----|------|------|------|-----|------|------|
| 0  | 0    | 1    | 2    | ... | 84   | 85   |
| 1  | 86   | 87   | 88   | ... | 170  | 171  |
| 2  | 172  | 173  | 174  |     | 256  | 257  |
| 3  | 258  | 259  | 260  |     | 342  | 343  |
| 22 | 1892 | 1893 | 1894 |     | 1976 | 1977 |
| 23 | 1978 | 1979 | 1980 |     | 2062 | 2063 |
| 24 | 2064 | 2065 | 2066 | ... |      | 2149 |
| 25 | 2150 | 2151 | 2152 | ... |      | 2235 |

Fig. 5

CRC/EDC CHECKER SYSTEM

This application is related to the following simultaneously-filed patent applications: U.S Patent application Ser. No. 08/306,918, filed Sep. 16, 1994 by Chris Zook and entitled "MULTIPURPOSE ERROR CORRECTION CALCULATION CIRCUIT"; U.S. Patent application Ser. No. 08/307,259, filed Sep. 16, 1994 by Chris Zook and entitled "VERSATILE ERROR CORRECTION SYSTEM"; all of the foregoing being incorporated herein by reference.

BACKGROUND

1. Field of Invention

This invention pertains to error correction systems, including but not limited to error correction systems which utilize CRC checking features.

2. Related Art and Other Considerations

Information storage devices, such as disk drives, generally have error correction capability. Information transduced from the device is typically stored in a buffer in the form of bytes. The stored information is usually formatted into a plurality of blocks of bytes. For a CD disk drive, for example, the buffer contains a plurality of sectors (when processing computer data) or frames (when processing digital audio data), collectively referred to herein as blocks.

In accordance with the error correction capability, each sector typically has a plurality of (Cyclical Redundancy Check) or EDAC (Error Detection and Correction) check bytes. FIG. 2 illustrates a block grouped into 86 columns of 26 bytes each. Within the block, each column of bytes comprises a column codeword, the last two bytes of each column constituting an ECC portion of the column codeword and the remaining (i.e., first 24 bytes) of each column constituting a data portion of the column codeword. For example, bytes 0000, 0086, 0172, . . . , 1978 comprise a data portion of column codeword $CW_0$; bytes 0001, 0087, 0173, . . . , 1979 comprise a data portion of column codeword CW1; and so forth. As illustrated in FIG. 2, the last four data bytes of each block (e.g., bytes 2060, 2061, 2062, 2063) contain error correction information and accordingly are known as EDC or CRC bytes. In some formats the CRC bytes are not necessarily the last bytes of the data portion of a block. For example, data formats which do not completely fill the blocks of FIG. 2 can place the CRC bytes following the end of data and follow the CRC bytes with pad bytes of zeros until the blocks are filled.

Beyond the operation of the error correction polynomial, the CRC or EDC check bytes provide an additional measure of check. In general, the CRC bytes are generated by treating the data bytes (or bits, as the case may be) as coefficients of the byte-valued (or bit-valued) data polynomial $D(x)$ and calculating $D(x)x^{n-k} \bmod G(x)$, where k is the number of data symbols, n–k is the number of CRC symbols, and $G(x)$ is the CRC generator polynomial. For a compact disk (CD) drive, the CRC generator is bit valued.

Historically, a check of the buffer which utilizes the CRC or EDC bytes occurs after the buffer has been corrected. Specifically, during an error correction phase, bytes of the buffer are accessed as codewords and operated upon by an error correction polynomial. Operation of the error polynomial upon the codewords results in the generation of error pointers which specify bytes of the codeword which are erroneous, as well as error patterns to be used for correcting the bytes located by the pointers. After generation by the error pointers and error patterns, bytes in the buffer are accessed for the purpose of correcting the pointer-specified bytes.

Subsequent to the correction of the pointer-specified bytes, the buffer is again accessed for the special purpose of CRC or EDC check. During the CRC or EDC check, the polynomial made up of all bytes in the buffer (including the CRC bytes) are divided by the CRC generator polynomial. If the remainder is zero, accurate correction of the block is confirmed.

While the CRC or EDC features advantageously provide an additional level of data integrity assurance, the specially required access of the buffer for the CRC/EDC check decreases overall operating speed.

SUMMARY

An EDC/CRC checker performs an EDC/CRC check as a block of data is being corrected during a correction pass, thereby obviating buffer access for EDC/CRC purposes subsequent to block correction. During the correction pass, an EDC/CRC sum is accumulated which, upon completion of the pass of the block, is zero if EDC/CRC bytes in the block confirm that the block has been corrected. During the single correction pass of the block, bytes of an uncorrected, most-recent codeword are added to the accumulated sum. Bytes of a previous codeword which have a byte synchronization relationship with the byte of the most-recent codeword are corrected (if necessary), and (when correction occurs) error pattern factors including error patterns used to correct the bytes of the previous codeword are also added to the accumulated sum. In the illustrated embodiment, the block is conceptualized has having columns of codewords and the byte synchronization relationship is such that when an uncorrected byte is being accumulated, correction occurs for a corresponding byte of a next previous codeword.

Thus, the EDC/CRC checker of the present invention allows performing the CRC check on block bytes that are being used for syndrome generation for a most recent codeword $CW_n$ during the same pass that correction is performed for correspondingly positioned bytes of a previous codeword (e.g., $CW_{n-1}$). When correction is performed for corresponding byte of the previous codeword, an error pattern factor for the corresponding byte of the previous codeword is also added to the accumulated sum, since such corresponding byte was earlier added to the sum as uncorrected. In actuality, the error pattern factor is a constant multiple of the error pattern. The value of the constant multiple is dependent upon the byte position synchronization relationship which is implemented.

Advantageously, the EDC/CRC checker of the present invention conducts an EDC/CRC check without requiring a separate access to the buffer. Moreover, the invention is compatible with data formats which do not completely fill the blocks and which can place the CRC bytes following the end of data and follow the CRC bytes with pad bytes of zeros until the blocks are filled.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

FIG. 2 illustrates a sector of data stored in a buffer, the sector being conceptualized as being stored in rows and columns.

FIG. 5 illustrates a buffer conceptualized as being divided into two interleaved blocks, each block in turn having bytes which are conceptualized as being organized in rows and columns.

DETAILED DESCRIPTION OF THE DRAWINGS

Figure 1:
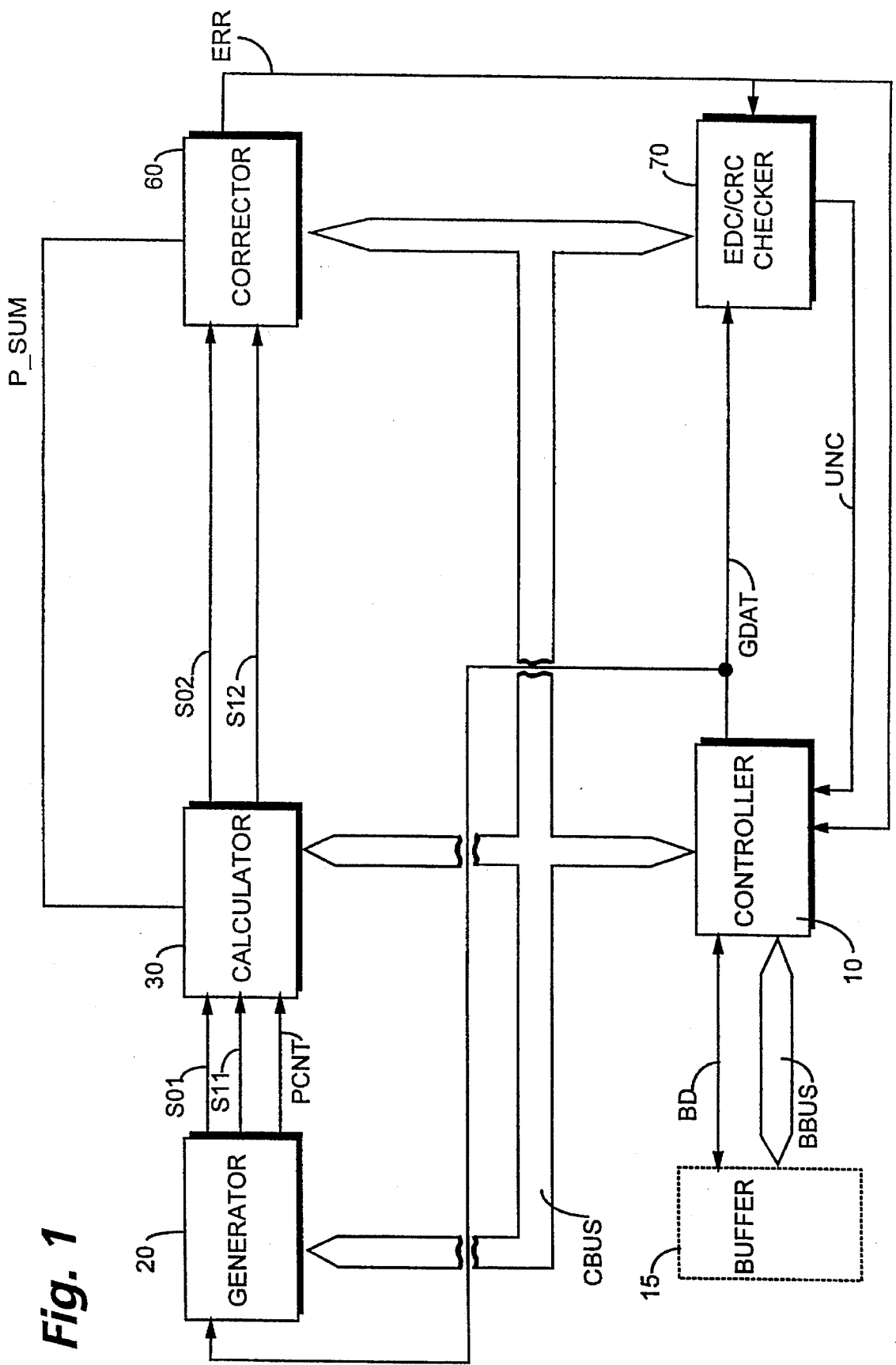
FIG. 1 is a schematic block diagram of an exemplary error correction system which utilizes an EDC/CRC checker according to the present invention.

FIG. 1 shows an error correction system which communicates via a system controller 10 with a buffer (depicted generally by phantom line 15). The buffer has stored therein a plurality of blocks such as that shown in FIG. 2. The error correction system of FIG. 1 further includes a generator or generation section 20 (e.g., for generating syndromes); a calculator or calculation section 30 (e.g., for calculating error patterns); a corrector or correction section 60; and an EDC checker section 70. All activity of the error correction system of FIG. 1 is supervised by controller 10, e.g., using control and other signals carried on bus CBUS.

As shown in FIG. 1, an EDC/CRC checker 70 is connected to receive error patterns from the corrector 60 on line ERR and buffer data on line GDAT. The system controller 10 supervises the overall operation of EDC/CRC checker 70, as well as the corrector 60 and access of the buffer, using control bus CBUS. An example of operation of the system controller and correction are understood in the context of a compact disk (CD) disk drive is understood with reference to U.S. Patent application Ser. No. 08/307,259, filed Sep. 16, 1994 by Chris Zook and entitled "VERSATILE ERROR CORRECTION SYSTEM", which is incorporated herein by reference. However, it should be understood that the principles of the present invention are not limited to such example, but are instead applicable to EDC/CRC checking in general.

As described in more detail hereinafter, under supervision of system controller 10, EDC/CRC checker 70 advantageously operates in coordination with the corrector 60 to perform an EDC/CRC verification of correction accuracy during the same pass of the buffer in which bytes are being corrected.

Figure 3A:
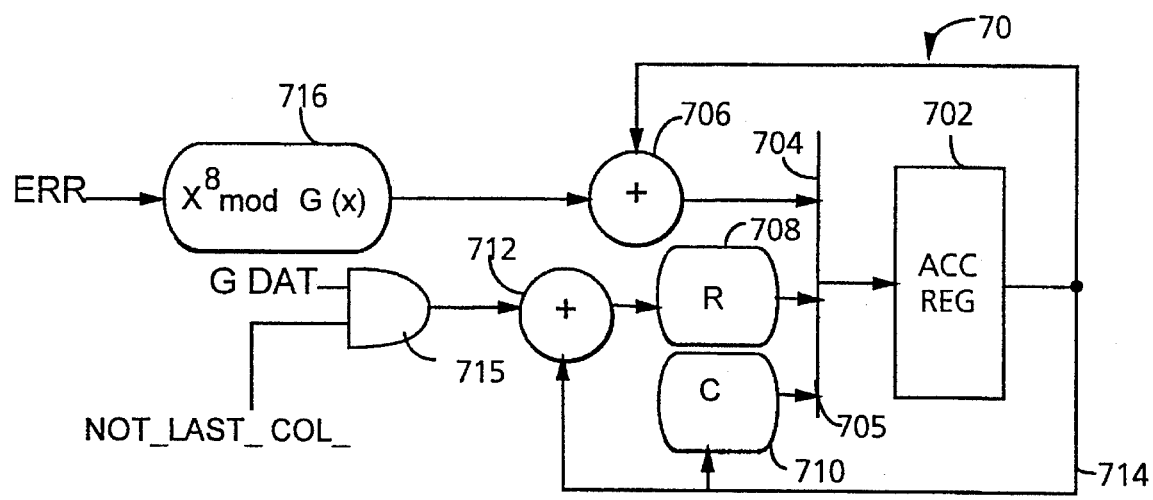
FIG. 3A is a schematic diagram showing an EDC/CRC checker circuit according to one embodiment of the invention.

FIG. 3A shows a functional schematic diagram of an EDC/CRC checker suitable for handling data (as stored in the buffer of FIG. 2) and for illustrating principles of the invention. Checker 70 of FIG. 3A features a memory in the form of an accumulation register 702. Accumulation register 702 is fed by a register feed switch or MUX 704, which is operated by a select line 705 connected ultimately to system controller 10. Register feed MUX 704 is connected to three alternative sources of signals: adder 706; row multiplier 708; and column multiplier 710. Row multiplier 708 is connected to adder 712. The contents of register 702—a residual or accumulated sum—is available on register output line 714. Register output line 714 is connected to column multiplier 710, adder 712, and adder 706.

Uncorrected data bytes from the buffer are applied on line GDAT to a first terminal of AND gate 715. A second terminal of AND gate 715 receives a signal NOT_LAST_COL from system controller 10. As long as checker 70 is still obtaining data bytes from the buffer for summation purposes, signal NOT_LAST_COL effectively gates uncorrected data bytes from the buffer through AND gate 715 for application to adder 712.

Adder 712 adds together the accumulated sum in register 702 (available on line 714) and uncorrected data bytes from the buffer (applied on line GDAT). The sum produced by adder 712 is applied as input to row multiplier 708. As mentioned before, output from row multiplier 708 is one of the selectable inputs applied to MUX 704.

Line ERR which carries the error pattern from corrector 60 is connected to a multiplier 716. In order to accommodate for a byte synchronization offset (e.g., column offset) between a current codeword and a previous codeword, multiplier 716 multiplies by a constant $x^8 \bmod G(x)$ to generate an error pattern factor. The product (error pattern factor) generated by multiplier 716 is applied to a first input terminal of adder 706, the second input terminal of adder 706 being connected to the register output line 714 as described above.

In FIG. 3A, the multiplication constant for row multiplier 708 is $x^{8\cdot 86} \bmod G(x)$, which serves to advance to the next row (i.e., to advance 86 bytes in the buffer, each byte being 8 bits). The multiplication constant for column multiplier 710 is $x^{-(86\cdot 24-1)\cdot 8} \bmod G(x)$, which serves to move from the last byte of a data portion of one column codeword to the top of the next column codeword (i.e., to move backward 2063 bytes in the buffer, each byte being 8 bits).

The FIG. 3A illustration subsumes that a byte of uncorrected data (on line GDAT) and an error pattern for another byte position synchronized byte of the block are not immediately available together, but instead are sequentially applied to the checker (error pattern first, followed by data byte). The FIG. 3B embodiment, on the other hand, shows a checker 70' wherein both an uncorrected data byte and error pattern are simultaneously accessible. In the FIG. 3B embodiment, adder 706 is removed, MUX 704 made a two-input switch, and the output of multiplier 716 is applied as a third input to adder 712.

Figure 4A:
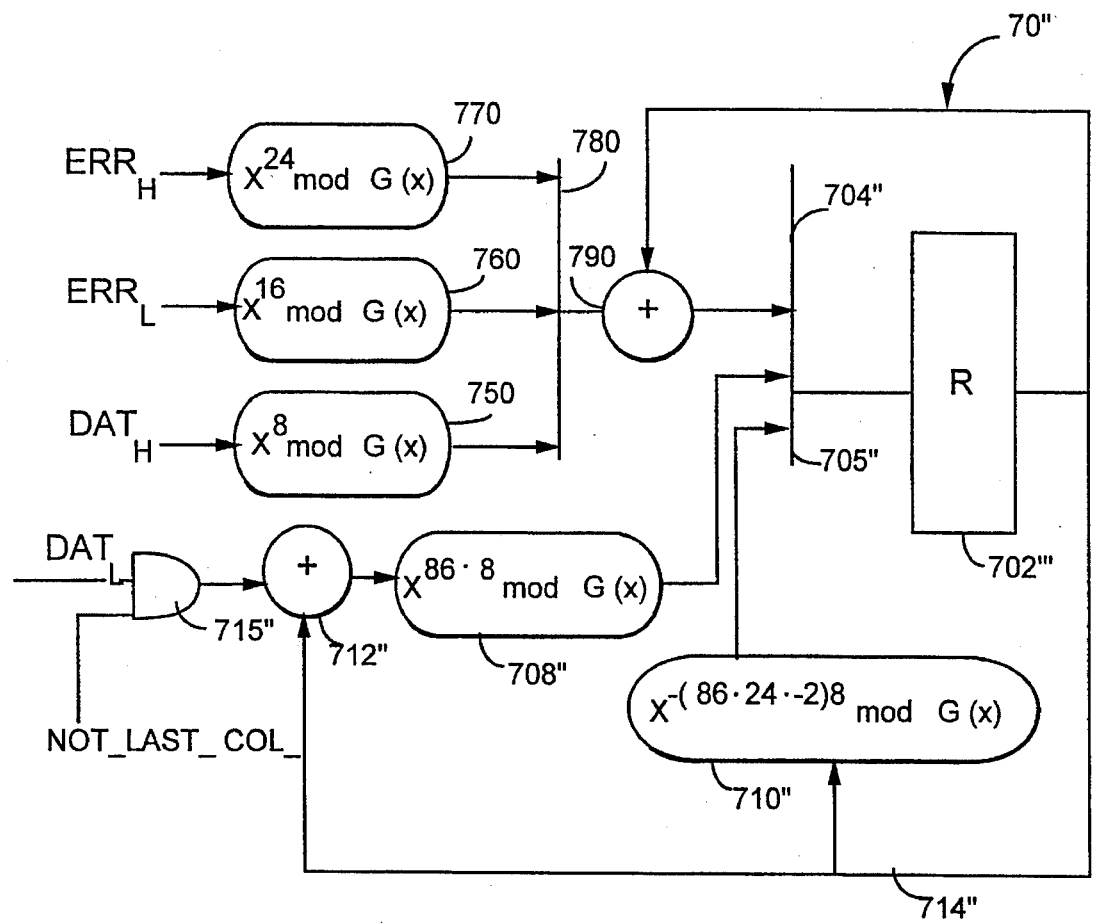
FIG. 4A is a schematic diagram showing an EDC/CRC checker circuit according to an embodiment of the invention in which two codewords (e.g., two columns) may be processed at a time.
Figure 5:
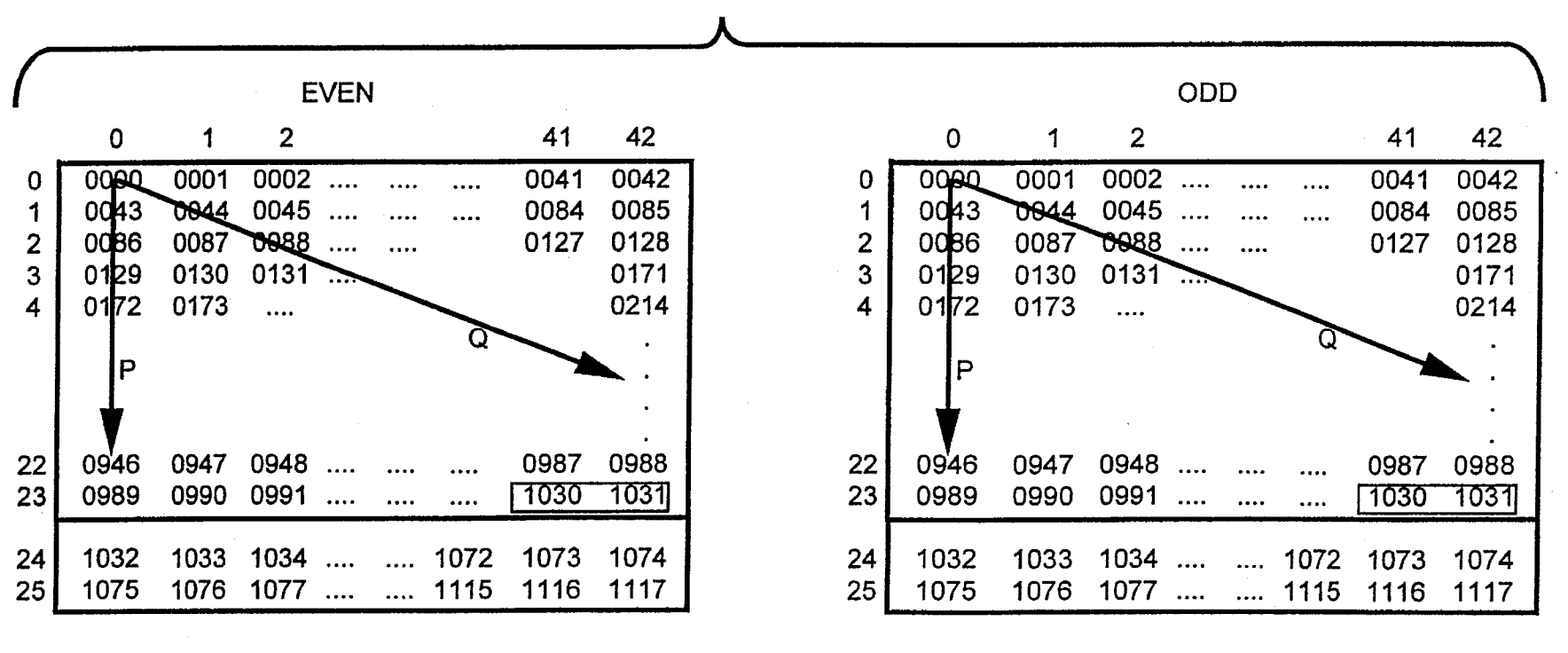

FIG. 4A shows a checker 70'' which is configured to process two codewords (e.g., two columns at a time), as may be desirable in some embodiments for performance reasons. The embodiment of FIG. 4A can be used, for example, when the buffer is conceptualized as including two interleaved blocks, and two codewords of the buffer are handled at one time. For example, FIG. 5 shows two interleaved blocks (even block and odd block), with bytes in each column of a block constituting a column codeword. That is, bytes represented as 0000, 0043, 0086, . . . 0989 form a data portion of a first column codeword for the even block; bytes 0001, 0044, 0087, . . . 0990 form a data portion of a second column codeword for the even block, and so on for a total of 43 column codewords in each of the even block and the odd block. Moreover, as shown in FIG. 5, the last two bytes of each block (particularly the bytes represented as 1030,1031) are EDC or CRC bytes.

Checker 70" of FIG. 4A includes an accumulation register 702". Feeding to register 702" is controlled by switch or MUX 704", as governed by select signal 705". Checker 70" receives four input signals—a lower order data input signal $DAT_L$; a lower order error pattern input signal $ERR_L$; a higher order data input signal $DAT_H$; and a higher order error pattern input signal $ERR_H$. With reference to an interleaved block scenario of FIG. 5, for example, the lower order inputs may correspond to an even block while the higher order inputs may correspond to an odd block. That is, $DAT_L$ may be the uncorrected data for a selected byte of column codeword $CWeven_N$ from the even block; $ERR_L$ may be the error pattern for a byte (in column codeword $CWevenN_{-1}$) which is in the prescribed byte synchronization relationship with the selected byte of column codeword $CWeven_N$; $DAT_H$ may be the uncorrected data for a selected byte of column codeword $CWodd_N$ from the odd block; $ERR_H$ may be the error pattern for a byte (in column codeword $CWoddN_{-1}$) which is in the synchronization relationship with the selected byte of column codeword $CWodd_N$.

Checker 70" further comprises five multipliers, including column multiplier 710"; row multiplier 708"; and multipliers 750, 760, and 770 provided on lines $DAT_H$, $ERR_L$, and $ERR_H$, respectively. The multiplication constants for the multipliers 708, 710, 750, 760, and 770 are provided by TABLE I.

TABLE I

| Multiplier | Multiplication Constant |
| --- | --- |
| 708 | $x^{86 \cdot 8} \mathrm{mod} G(x)$ |
| 710 | $x^{-(86 \cdot 24-2) \cdot 8} \mathrm{mod} G(x)$ |
| 750 | $x^8 \mathrm{mod} G(x)$ |
| 760 | $x^{16} \mathrm{mod} G(x)$ |
| 770 | $x^{24} \mathrm{mod} G(x)$ |

Outputs of multipliers 750, 760, 770 are connected to respective input terminals of a switch or MUX 780. An output terminal of MUX 780 is connected to a first input terminal of adder 790; a second input terminal of adder 790 being connected to output line 714" of register 702". An output terminal of adder 790 is connected to a first input terminal of MUX 704", the other two input terminals of MUX 704" being connected to output terminals of multipliers 708" and 710". As in the FIG. 3A embodiment, line $DAT_L$ has AND gate 715" connected thereon for gating therethrough the data bytes as long as signal NOT_LAST_COL is on.

Figure 4C:
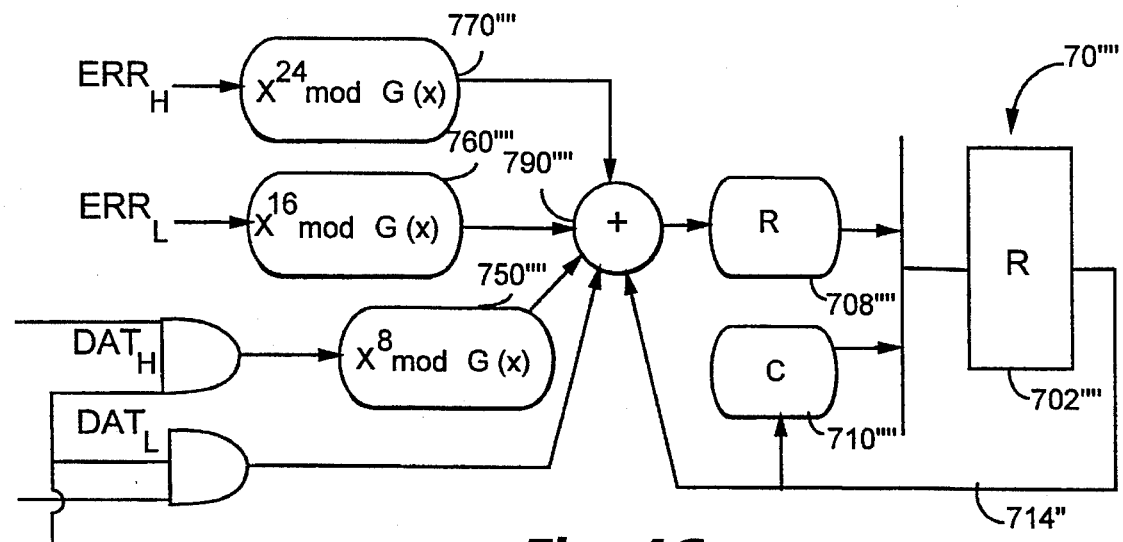
FIG. 4C is a schematic diagram showing an EDC/CRC checker circuit according to an embodiment of the invention in which two codewords (e.g., two columns) may be processed at a time, and in which data bytes and error patterns are essentially simultaneously accessible.
Figure 4B:
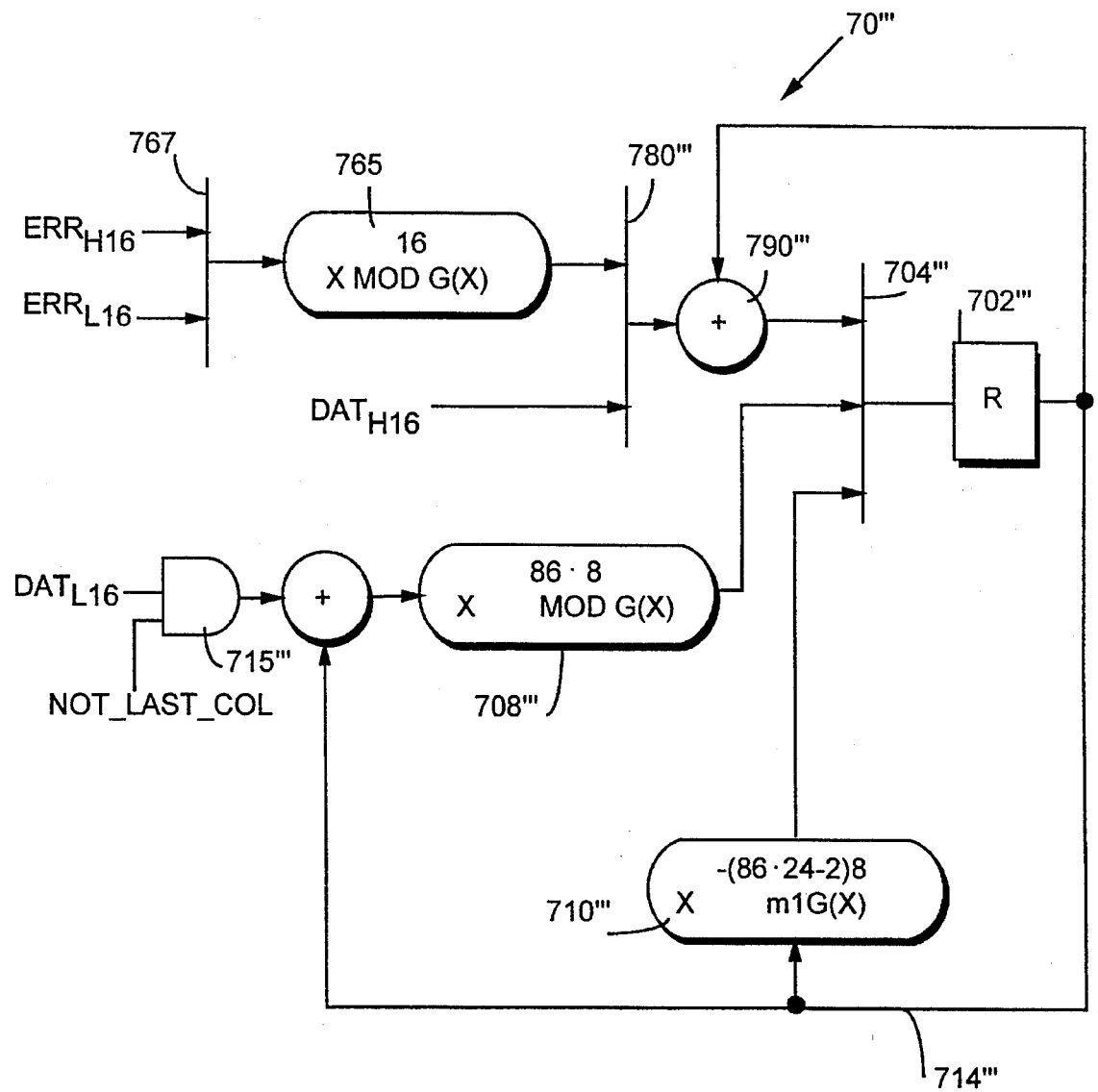
FIG. 4B is a schematic diagram showing an EDC/CRC checkers circuit which is equivalent to the circuit of FIG. 4A.

FIG. 4B shows a checker circuit 70''' which is essentially the equivalent of circuit 70" of FIG. 4A. Checker circuit 70''' of FIG. 4B differs from circuit 70" of FIG. 4A in few respects. A first difference involves the format of signals $DAT_{L16}$, $DAT_{H16}$, $ERR_{H16}$, and $ERR_{L16}$, which are transformed into 16 bit values. In particular, $ERR_{H16}$ is a 16 bit value obtained by concatenating $ERR_H$ and 8 zero bits with $ERR_H$ in the high order position. $ERR_{L16}$ is a 16 bit value obtained by concatenating 8 zero bits with $ERR_L$, $ERR_L$ being in the low order position. $DAT_{H16}$ and $DAT_{L16}$ are formed in analogous manner with $ERR_{H16}$ and $ERR_{l16}$, respectively. Since the error and data bytes prior to concatenation are each 8 bits in length and the CRC polynomials are 16 bits in length, multiplication of ERR or DAT by $X^8$ is simply a shift from the low 8 bits to the high 8 bits, and (as discussed below) facilitates the use of multiplier 765 in FIG. 45 rather than the multipliers 750, 760, and 770 of FIG. 4A.

A second difference between FIG. 45 and FIG. 4A is that lines $ERR_{H16}$ and $ERR_{l16}$ feed MUX 767, which in turn feeds multiplier 765. The multiplication constant of multiplier 765 is $x^{16} \mathrm{mod} G(x)$. Multiplier 765 and $DAT_{H16}$ both are connected to MUX 780'''. The output of MUX 780''' is connected to adder 790'''.

Figure 7:
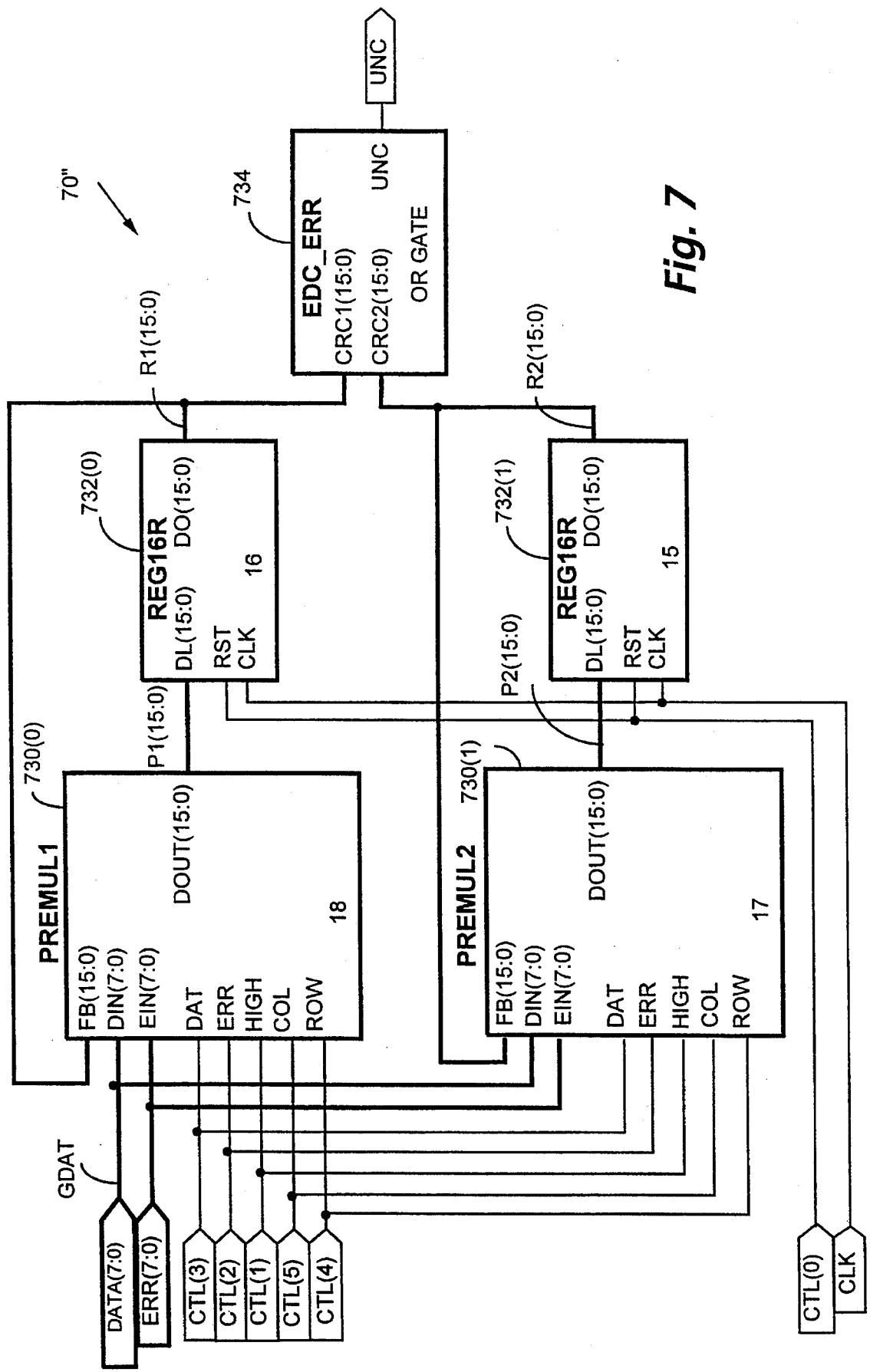
FIG. 7 is a schematic block diagram showing a chip-oriented implementation of the checker of FIG. 4A.

FIG. 7 shows a chip-oriented implementation of FIG. 45 which provides two CRC/EDC circuits for making two checks with two 16 bit polynomials. Checker 70''' of FIG. 7 comprises a pair of premultiplier chips 730(0), 730(1); a pair of accumulation registers 732(0), 732(1); and a EDC comparitor 734. In checker 70''', both circuits (via respective premultipliers 730(0), 730(1)) receive the same error patterns followed by the same data.

In FIG. 7, premultiplier 730(0) utilizes the polynomial $x^{16}+x^{15}+x^2+1$. For each multiplier utilizes polynomial $x^{16}+x^2+x+1$. For each multiplier shown in FIG. 45, for example, each premultiplier 730 in FIG. 7 has its own set of XOR logic gates. The configuration of the set of logic gates for a multiplier of a premultiplier 730 is equivalent to multiplying the input signal to the particular multiplier by a 16×16 binary matrix unique for that multiplier (e.g., pairing up rows and columns and taking the inner product) to obtain a 16 bit output signal. As discussed above with respect to the signals $DAT_{L16}$, $DAT_{H16}$, $ERR_{H16}$, and $ERR_{L16}$, prior to the multiplication, the input signal (e.g, 8 bit input vector such as $DAT_L$, for example) is padded at one end or the other with 8 zeros to make a 16 bit vector for the multiplication (yielding vector $DAT_{L16}$, for example).

The bits of an output vector of each multiplier is a linear combination of the bits of the input vector and hence can be obtained by a matrix multiplication, i.e., $[O]=[I][T]^K$ where [I] and [O] are the input and output row vectors with bit 0 on the right and [T] is the matrix for multiplying by $x \mathrm{mod} G(x)$.

With respect to premultiplier 730(0), the 16×16 binary matrix illustrating the multiplication of multiplier 765 is provided in TABLE 2; the matrix for row multiplier 708" is provided in TABLE 3; the matrix for column multiplier 710" is provided in TABLE 4. With respect to premultiplier 730(1), the 16×16 binary matrix illustrating the multiplication of multiplier 765 is provided in TABLE 5; the matrix for row multiplier 708" is provided in TABLE 6; the matrix for column multiplier 710" is provided in TABLE 7.

As an example of the foregoing, $ERR_H \cdot X^{24} \mathrm{mod} G_1(x) = ERR_H \cdot X^8 \cdot X^{16} \mathrm{mod} G_1(x) = ERR_{H16} \cdot X^{16} \mathrm{mod} G_1(x)$ $[I] = [E_0\ E_1\ E_2\ \ldots\ E_7\ 0\ 0\ 0\ 0\ 0\ 0\ 0\ 0]$ BIT 0 of output is $E_0+E_2+E_3+E_4+E_5+E_6+E_7$.

Like FIG. 3A, the FIG. 4A and FIG. 4B illustrations subsume that two bytes of uncorrected data (on line GDAT) and two error patterns for another byte position synchronized byte of the block are not immediately available together, but instead are sequentially applied to checker 70''' (error patterns first, followed by data bytes). The FIG. 4C embodiment differs from the FIG. 4A embodiment in that checker 70''' of FIG. 4C processes essentially simultaneously available pairs of data bytes and error patterns. The row and column multiplier constants for the FIG. 4C embodiment are the same as those for the FIG. 4A embodiment.

In the FIG. 4C embodiment, checker 70'''' comprises register 702'''' which is fed (via two-input MUX 705'''') by either column multiplier 710'''' or row multiplier 708''''. Register output line 714'''' is connected to a first input terminal of adder 790'''', with four other input terminals of adder 790'''' being connected to respective lines $DAT_L$, $DAT_H$, $ERR_L$, and $ERR_H$. Lines $DAT_H$, $ERR_L$, and $ERR_H$ have multipliers 750'''', 760'''', and 770'''', respectively, connected thereon. The output terminal of adder 790'''' is applied to the input terminal of row multiplier 708'''' AND gates 715'''' are provided on lines $DAT_L$ and $DAT_H$.

OPERATION

As described above with reference to FIG. 2 for example, a sector for the present invention comprises a block of 86 columns, with bytes in each column of the block constituting a codeword. For CRC/EDC checking purposes, only data portions of codewords are utilized. Accordingly, unless otherwise specified, "codeword" as used hereinafter means only the data portion of the codeword (excluding an ECC portion of the codeword). For example, bytes represented as 0000, 0086, 0172, ... 1978 form a data portion of a first column codeword; bytes 0001, 0087, 0173, ... 1979 form a data portion of a second codeword, and so on for a total of 86 codewords for the block. Moreover, as shown in FIG. 1, the last four data bytes of each block (particularly the bytes represented as (e.g., bytes 2060, 2061, 2062, 2063) are EDC or CRC bytes.

Steps involved in the supervision of EDC/CRC checker 70 by the system controller are shown in FIG. 7. In step S2, values of counters ROWCOUNT and COLCOUNT, as well as the value (REGSUM) in the accumulation register 702, are initialized at zero. Also, a last column flag (LASTCOL) is initialized to FALSE. Following initialization step S2, a loop comprising even numbered steps S4 through S22 is executed.

At the beginning of the loop (step S4), a determination is made whether a correction is being made for a byte in the buffer which is in a synchronized byte relationship with the byte referenced by the current values of ROWCOUNT and COLCOUNT. Since, in the illustrated embodiment, the byte synchronization relationship is such that correction occurs for a previous codeword (i.e., for byte ROWCOUNT of the previous codeword, i.e., [COLCOUNT−1,ROWCOUNT]), no correction will be implemented when executing the loop for the first column codeword in the buffer.

In particular, for the illustrated embodiment, the byte position synchronization is such that at step S2 it is determined whether an error pattern exists for byte (COLCOUNT−1,ROWCOUNT) of the block. As mentioned above, the determination of step 1608 will be negative when processing the first codeword of a block. However, the determination during processing of subsequent column codewords is representatively illustrated by the following: when byte 0001 of FIG. 1 is accessed by the current values of ROWCOUNT and COLCOUNT, a determination regarding generation of an error pattern is made for byte 0000; when byte 0087 of FIG. 1 is indicated by the current values of ROWCOUNT and COLCOUNT, a determination regarding generation of an error pattern is made for byte 0086; etc. It should be understood that the invention is not limited to this particular byte synchronization relationship, as other offsets (e.g., columnar offsets of differing degrees) can be employed as is fitting in accordance with other considerations of the overall system.

For executions of the loop corresponding to codewords other than the first codeword, the corresponding byte of the previous codeword may require correction. When correction is required, at step S6 an error pattern factor for the synchronized byte (e.g., the synchronized byte of the previous codeword) is added to register 702. The error pattern factor is obtained by multiplying the error pattern (E(x), carried by signal ERR) by a multiplier constant ($x^8 modG(x)$) using multiplier 716. In other words, at step S6 register 702 gets REGSUM+$E(x)x^8 modG(x)$. The fact that the synchronized byte is offset by one column (i.e., by one byte or 8 bits) from the most-recently accessed byte of the block is the reason why the error pattern for the synchronized byte must be multiplied by $x^8 modG(x)$. During the same execution of the loop, the error pattern utilized in step S6 is also used to correct the data byte in the block in the buffer.

At step S8 it is determined whether all uncorrected data bytes from the buffer have been already been added into register 702 (i.e., whether COLCOUNT has exceeded the number of codewords in the buffer). This determination is made by checking the value of flag LASTCOL. If all uncorrected data bytes from the buffer have not been added, execution continues with step S10. Otherwise, execution continues with step S12.

At step S10, checker 70 obtains the next uncorrected data byte from the block. In particular, at step S10 the next uncorrected data byte from the block is data byte (COLCOUNT, ROWCOUNT). For the first execution of the loop, the first byte obtained will be byte 0000. For successively further executions of the loop, at step S10 further bytes of the block are accessed in ECC column codeword order (e.g, bytes 0086, 172, ... , 1978, 0001, 0087, ... , 1979, 0002, ... 063). At step S10, the byte obtained at step S10 is applied (on line GDAT) and added (by adder 712) to the accumulated sum (REGSUM) in register 702. The sum of adder 712 is, in turn, multiplied by the row-advancing multiplication constant $x^{86 \cdot 8} modG(x)$ of row multiplier 708, and the product stored in register 702. Thus, at step S10, a next uncorrected data byte factor $D(x)x^{86 \cdot 8} modG(x)$ is added to the value in register 702 (REGSUM).

Step S12 is executed when all uncorrected data bytes from the block have already been added to register 702 (e.g., as at step 710), and only the processing of error pattern factors for the last codeword is occurring. At step S12, the contents of register 702 gets multiplied by the multiplication constant $x^{86 \cdot 8} modG(x)$ of row multiplier 708.

After execution of either step S10 or S12, at step S14 the value of ROWCOUNT is incremented by one. If, as determined at step S16, the incremented value of ROWCOUNT does not equal 24, the loop beginning at step S4 is executed for the next byte of the current codeword. However, if the incremented value of ROWCOUNT does equal 24, step S18 is executed. The value of ROWCOUNT is not permitted to exceed 24, since there are only 24 data bytes in each column codeword.

At step S18, in view of advancement to a new column, column multiplier 710 serves to multiply the contents of register 702 by the column-adjusting constant $x^{-(86\cdot 24-1)\cdot 8} \mod G(x)$.

After step S18, at step S20, ROWCOUNT is reset to zero and COLCOUNT is incremented by one. Step S22 checks whether the flat LASTCOL is set. If flag LASTCOL is not set, a check is made (at step S24) to see if the value of COLCOUNT has surpassed the number of the last column (e.g., COLCOUNT is 86). If the last column (e.g., last codeword) of the block has not been surpassed, execution continues back to step S2 for the first byte of a new codeword of the block. Otherwise, flag LASTCOL is set TRUE at step S26 prior to returning back to step S2 to process any error patterns for the last codeword of the block.

After error pattern factors (if any) for the last codeword of the block have been added to register 702, the setting of flag LASTCOL to TRUE causes (at step S22) execution to jump to step S28. At step S28, a determination is made whether the value in register 702 (i.e., the value REGSUM) is zero. The value in register 702 upon all completions of the loop is the remainder upon dividing the polynomial made up of all bytes in the buffer (including the CRC bytes) by the CRC generator polynomial. A zero value for register 702 validates that the error correction performed by corrector 60 is accurate.

Thus it is seen that the adding to register 702 of potentially corrupted (i.e., uncorrected) data byte of the block is time coordinated with the adding to register 702 of an error pattern factor (if any) for a positionally synchronized byte of the block.

Figure 3B:
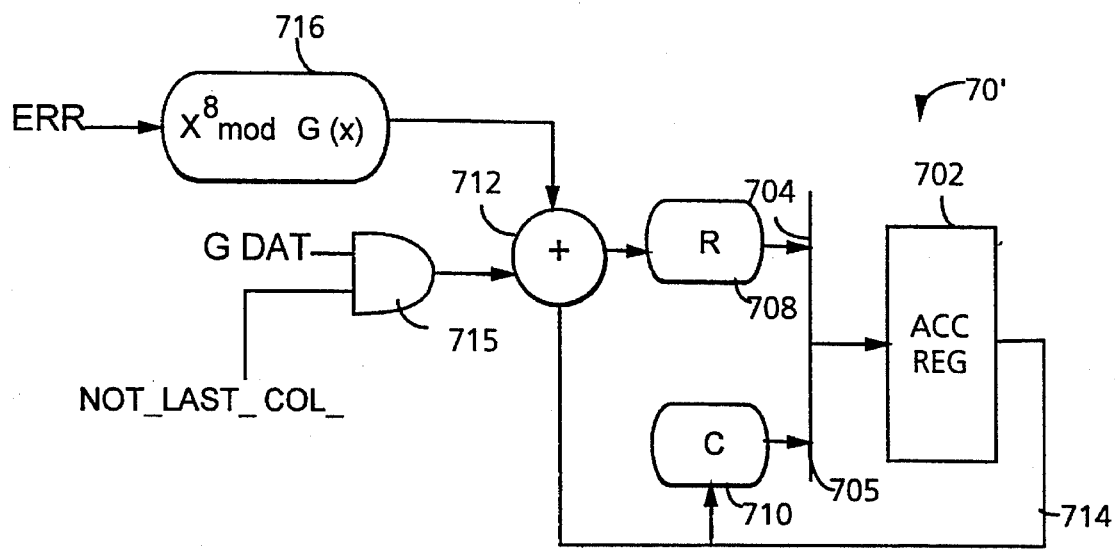
FIG. 3B is a schematic diagram showing an EDC/CRC checker circuit according to an embodiment of the invention in which data bytes and error patterns are essentially simultaneously accessible.
Figure 6:
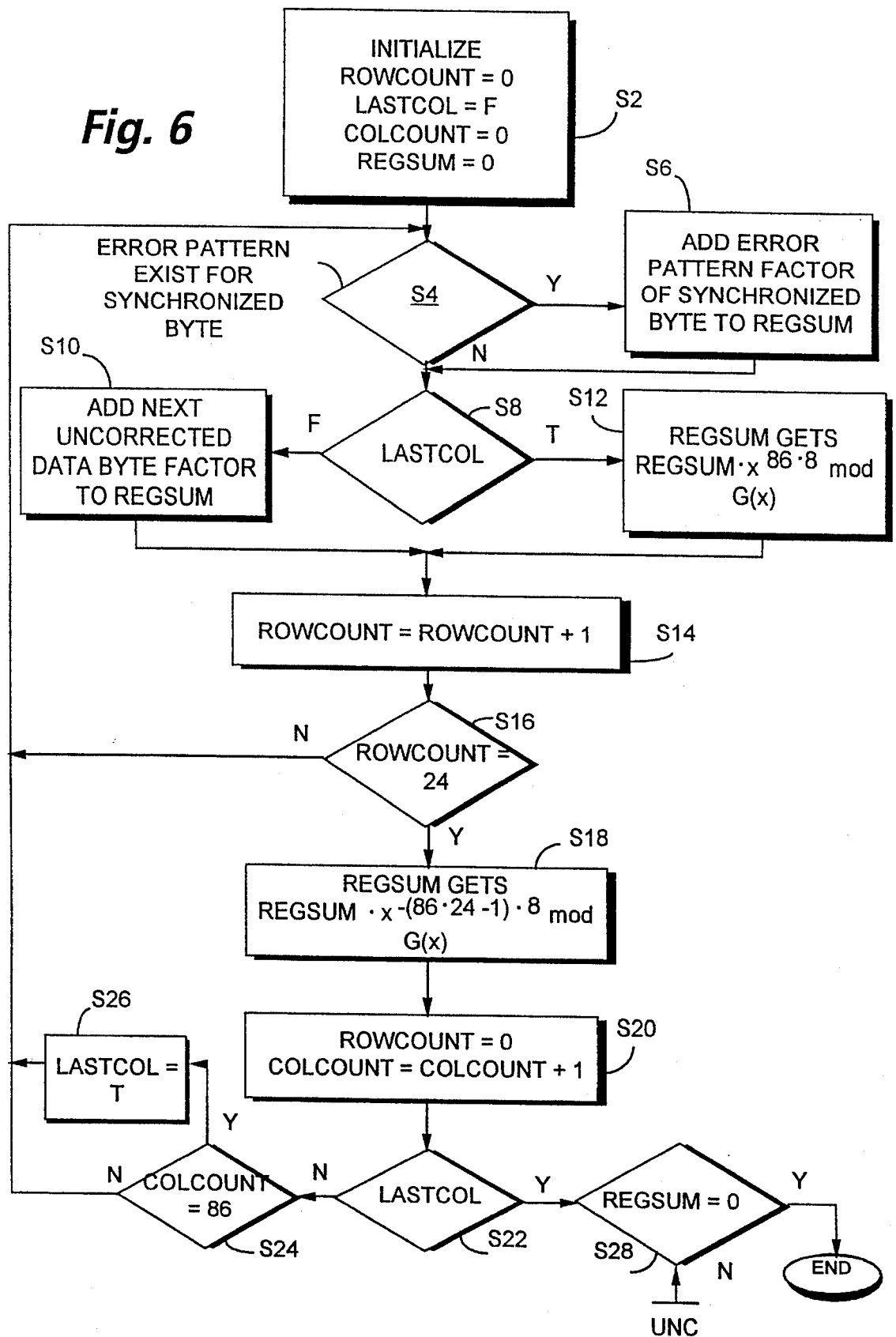
FIG. 6 is a flowchart depicting steps involved in an EDC/CRC checking operation.

The operations of checker 70' of FIG. 3B, checker 70" of FIG. 4A, checker 70''' of FIG. 4B, and checker 70'''' of FIG. 4C are understood with reference to the preceding discussion of the steps involved in FIG. 7. In FIG. 4A, FIG. 4B, and FIG. 4C, two codewords are handled at a time. In the FIG. 7 embodiment, the steps of FIG. 6 are executed for each of the two constituent checker circuits 70''', with each constituent checker circuit receiving the same data but operating with a different one of the two 16 bit polynomials. At the end, both checker circuits must result in zeros for the block to be correctable.

Thus, it is seen from the foregoing that, in accordance with the present invention, a CRC/EDC check is conducted during the same pass through the buffer in which data byte correction is effected. The method of the present invention involves sequentially accessing bytes in a buffer and adding a first selected byte of the buffer to an accumulated sum (e.g., step S10), the accessed byte not yet having undergone correction if correction thereof is required. While the pass is pointing to the first selected byte, a second byte of the block is corrected using an error pattern for the second byte, there being a byte position synchronization relationship between the first selected byte and the second selected byte and the second byte as uncorrected already having been added to the accumulated sum. An error pattern factor for the second byte is added to the accumulated sum (e.g., step S6). Subsequently, but during the same pass, an error pattern factor for the first byte is added to the accumulated sum.

While the invention has been particularly shown and described with reference to the preferred embodiments thereof, it will be understood by those skilled in the art that various alterations in form and detail may be made therein without departing from the spirit and scope of the invention. For example, if desired, more than two interleaves can be accommodated.

TABLE 2

```
1000000000001001
1000000000000110
0100000000000011
1110000000000011
1011000000000011
1001100000000011
1000110000000011
1000011000000011
1000001100000011
1000000110000011
1000000011000011
1000000001100011
1000000000110011
1000000000011011
1000000000001111
1000000000000101
```

TABLE 3

```
0001111111110110
0000111111111011
1100011111111111
1010001111111101
1001000111111100
0100100011111110
0010010011111111
1101001000111101
1010100100011100
0101010010001110
0010101001000111
1101010100100001
1010101010010010
0101010101001001
1110101010100110
0111010101010011
```

TABLE 4

```
0011011110110100
0001101111011010
0000110111101101
1100011011110100
0110001101111010
0011000110111101
1101100011011100
0110110001101110
0011011000110111
1101101100011001
1010110110001110
0101011011000111
1110101101100001
1011010110110010
0101101011011001
1110110101101110
```

TABLE 5

```
1000000000001001
1100000000000111
1110000000000000
0111000000000000
0011100000000000
0001110000000000
0000111000000000
0000011100000000
0000001110000000
0000000111000000
0000000011100000
0000000001110000
0000000000111000
0000000000011100
0000000000001110
```

TABLE 5-continued

0000000000000111

TABLE 5

0001010111000000
0000101011100000
0000010101110000
0000001010111000
0000000101011100
0000000010101110
0000000001010111
1000000000101000
0100000000010100
0010000000001010
0001000000000101
1000100000000001
1100010000000011
1110001000000010
0111000100000001
1011100010000011

TABLE 7

1110111000100011
1111011100010010
0111101110001001
1011110111000111
1101111011100000
0110111101110000
0011011110111000
0001101111011100
0000110111101110
0000011011110111
1000001101111000
0100000110111100
0010000011011110
0001000001101111
1000100000110100
0100010000011010

The embodiments of the invention in which an exclusive property or privilege is claimed are defined as follows:

1. A system for checking bytes of information stored in block form in a buffer, the system comprising:
   a correction unit which outputs error patterns for use in correcting specified bytes of the block during a correction access of the buffer;
   a CRC/EDC checker which operates upon the bytes of the block during the correction access of the buffer and uses CRC/EDC information to confirm that the block is corrected.

2. The system of claim 1, wherein the CRC/EDC checker operates to sum the bytes of the block.

3. The system of claim 2, wherein during the correction access there is a byte position synchronization relationship between a byte being corrected and a byte being summed.

4. The system of claim 3, wherein during the correction pass the checker adds a selected byte from the block to the sum and thereafter, as the selected byte is being corrected using an error value for the selected byte, also adds to the sum a factor which includes the error value for the selected byte.

5. The system of claim 2, wherein during the correction pass the checker adds a selected byte from the buffer to the sum and thereafter, as the selected byte is being corrected using an error value for the selected byte, also adds to the sum a factor which includes the error value for the selected byte.

6. A system which checks bytes of information in a buffer in synchronization with correction of bytes in the buffer by a correction unit, the checker comprising:
   a memory device wherein a sum is accumulated;
   an adder which adds to the sum accumulated in the memory the following:
   (1) a byte of the buffer that has not yet been corrected by the correction unit;
   (2) an error pattern for a byte that has already been added to the sum;
   an CRC/EDC checker which evaluates the sum to confirm correction by the correction unit.

7. The checker of claim 6, wherein the byte added to the sum has a byte location synchronization relationship with the byte for which the error pattern is being added.

8. The checker of claim 7, wherein the buffer is conceptualized as comprising a plurality of columns and rows, and wherein the byte added to the buffer and the byte for which the error pattern is added are in a same row.

9. The checker of claim 7, wherein the error pattern is included in an error pattern factor which is added to the accumulated sum, and wherein the error pattern factor further includes a constant multiple.

10. The checker of claim 9, wherein a value of the constant multiple is dependent upon the byte location synchronization relationship.

11. A method for checking bytes of information stored in a buffer, the method comprising:
    accessing a first selected byte in the buffer and adding the first selected byte to an accumulated sum;
    using an error pattern for a second selected byte in the buffer to correct the second selected byte in the buffer;
    adding the error pattern for the second selected byte to the accumulated sum;
    using the sum to confirm that the error pattern corrects the second selected byte.

12. The method of claim 11, wherein there is a byte position synchronization relationship between the first selected byte and the second selected byte.

13. The method of claim 12, wherein the buffer is conceptualized as comprising a plurality of columns and rows, and wherein the first selected byte and the second selected byte are in a same row.

14. The method of claim 12, wherein the error pattern is included in an error pattern factor which is added to the accumulated sum, and wherein the error pattern factor further includes a constant multiple.

15. The method of claim 14, wherein a value of the constant multiple is dependent upon the byte location synchronization relationship.

16. A method of checking bytes of information stored in a buffer, the method comprising:
    sequentially accessing bytes in a buffer;
    adding a first selected byte of the buffer to an accumulated sum, the first selected byte not yet having undergone correction if correction thereof is required;
    correcting a second selected byte in the buffer using an error pattern for the second selected byte;
    adding the error pattern for the second selected byte to the accumulated sum; and
    using the accumulated sum to confirm correction of the second selected byte.

17. The method of claim 16, wherein there is a byte position synchronization relationship between the first selected byte and the second selected byte.

18. The method of claim 16 wherein the buffer is conceptualized as comprising a plurality of columns and rows, and wherein the byte added to the buffer and the byte for which the error pattern is added are in a same row.

19. The method of claim 16, wherein the error pattern is included in an error patter factor which is added to the accumulated sum, and wherein the error pattern factor further includes a constant multiple.

20. The method of claim 19, wherein a value of the constant multiple is dependent upon the byte location synchronization relationship.

21. A method of checking bytes of information stored in block format in a buffer during one pass of the buffer, the method comprising:

adding a first selected byte to an accumulated sum during the one pass; then subsequently but during the same pass, adding to the accumulated sum an error pattern for the first selected byte; and using the accumulated sum to confirm that the error pattern corrects the first selected byte.

22. The method of claim 21, further comprising using the error pattern to correct the first selected byte after the first selected byte has been added to the accumulated sum.

23. The method of claim 22, wherein the error pattern is included in an error pattern factor which is added to the accumulated sum, and wherein the error pattern factor further includes a constant multiple.

24. The method of claim 23, wherein a value of the constant multiple is dependent upon the byte location synchronization relationship.

25. A method of checking bytes of information stored in block format in a buffer, the method comprising:

sequentially accessing bytes in the buffer in a single pass access through the block;

adding, when accessed, a first byte to an accumulated sum; the first byte not yet having been corrected should correction be required;

correcting a second byte of the block using an error pattern for the second byte; the second byte as uncorrected already having been added to the accumulated sum;

adding an error pattern for the second byte to the accumulated sum; then subsequently but during the same pass, adding a third byte to the accumulated sum;

correcting the first byte with an error pattern for the first byte;

adding an error pattern for the first byte to the accumulated sum; and using the accumulated sum to confirm that the error pattern corrects the second byte.

26. The method of claim 25, wherein there is a byte position synchronization relationship between the first selected byte and the second selected byte.

27. The method of claim 26, wherein the buffer is conceptualized as comprising a plurality of columns and rows, and wherein the first selected byte and the second selected byte are in a same row.

28. The method of claim 26, wherein the error pattern is included in an error pattern factor added to the accumulated sum, and wherein the error pattern factor further includes a constant multiple.

29. The method of claim 28, wherein a value of the constant multiple is dependent upon the byte location synchronization relationship.

30. The method of claim 25, wherein upon completion of the single pass access through the block the accumulated sum is zero if the block has been properly corrected.

31. A method of performing an EDC/CRC check for bytes in a block of data in a buffer, the method comprising:

sequentially accessing uncorrected data bytes in the block and adding each uncorrected data byte when accessed to an accumulated sum;

determining, as an uncorrected data byte is accessed, whether a location-related data byte in the block has an available error pattern, the location-related data byte already having been added to the accumulated sum; and, if an available error pattern exists, adding the available error pattern for the location-related data byte to the accumulated sum; and using the accumulated sum to confirm that the available error pattern corrects the location-related data byte.

32. The method of claim 31, further comprising correcting the location-related data byte during the sequential accessing of uncorrected data bytes in the block.

33. The method of claim 31, wherein the location-related data byte is in a byte synchronized relationship with the accessed uncorrected data byte.

34. A method of performing an EDC/CRC check for bytes in a block of data in a buffer, the bytes being organized into codewords, the method comprising:

sequentially adding uncorrected data bytes for a most-recent codeword in the block to an accumulated sum;

determining, as an uncorrected data byte for the most-recent codeword is accessed, whether a corresponding data byte in a previous codeword has an available error pattern, the corresponding data byte of the previous codeword already having been added to the accumulated sum; and, if an available error pattern exists, adding the available error pattern for the corresponding data byte of the previous codeword to the accumulated sum; and using the accumulated sum to confirm that the block has been corrected.

35. The method of claim 34, further comprising correcting the corresponding data byte of the previous codeword while uncorrected data bytes of the most-recent codeword are being added to the accumulated sum.

36. The method of claim 34, wherein the corresponding data byte of the previous codeword is in a byte synchronized relationship with the data byte of the most-recent codeword which is being added to the accumulated sum.

* * * * *